(12) United States Patent
Namai et al.

(10) Patent No.: US 10,622,987 B2
(45) Date of Patent: Apr. 14, 2020

(54) SEMICONDUCTOR DEVICE AND APPARATUS

(71) Applicants: Kabushiki Kaisha Toshiba, Minato-ku, Tokyo (JP); Toshiba Electronic Devices & Storage Corporation, Minato-ku, Tokyo (JP)

(72) Inventors: Atsushi Namai, Kawasaki Kanagawa (JP); Junichi Todaka, Oita Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/284,182

(22) Filed: Feb. 25, 2019

(65) Prior Publication Data
US 2020/0083878 A1    Mar. 12, 2020

(30) Foreign Application Priority Data

Sep. 7, 2018    (JP) .................................. 2018-167723

(51) Int. Cl.
*H03K 17/082* (2006.01)
*H03K 19/20* (2006.01)

(52) U.S. Cl.
CPC ......... *H03K 17/0822* (2013.01); *H03K 19/20* (2013.01); *H03K 2217/0054* (2013.01)

(58) Field of Classification Search
CPC ......... H03K 17/0822; H03K 217/0054; H03K 19/20

USPC .......................... 327/108, 109, 110, 111, 112
See application file for complete search history.

(56) References Cited

U.S. PATENT DOCUMENTS

| 6,177,818 B1 * | 1/2001 | Bertin .............. H03K 19/00361 |
| | | 326/25 |
| 7,872,461 B2 | 1/2011 | Yamada |
| 8,415,989 B2 | 4/2013 | Shinoda et al. |

FOREIGN PATENT DOCUMENTS

| JP | 4545525 B2 | 9/2010 |
| JP | 5217849 B2 | 6/2013 |
| JP | 5422922 B2 | 2/2014 |

* cited by examiner

*Primary Examiner* — John W Poos
(74) *Attorney, Agent, or Firm* — White & Case LLP (57) ABSTRACT

According to one embodiment, a semiconductor device includes an output circuit; a detection circuit; and a control circuit. The output circuit includes a first transistor which includes one end of a current path connected to an output node, receives a first input signal, and outputs a first voltage, and a second transistor which includes one end of a current path connected to the output node, receives a second input signal, and outputs a second voltage. The output circuit outputs the first voltage or the second voltage. The detection circuit detects the voltage and outputs a detection result. The control circuit controls back-gate potentials of the first and the second transistors.

16 Claims, 6 Drawing Sheets

SEMICONDUCTOR DEVICE AND APPARATUS

CROSS-REFERENCE TO RELATED APPLICATIONS

This application is based upon and claims the benefit of priority from Japanese Patent Application No. 2018-167723, filed Sep. 7, 2018, the entire contents of which are incorporated herein by reference.

FIELD

Embodiments described herein relate generally to a semiconductor device.

BACKGROUND

A driver circuit with a function to prevent an electric current from being reversed between input/output terminals is known.

DETAILED DESCRIPTION

According to one embodiment, a semiconductor device includes an output circuit; a detection circuit; and a control circuit. The output circuit includes a first transistor which includes one end of a current path connected to an output node, receives a first input signal, and outputs a first voltage, and a second transistor which includes one end of a current path connected to the output node, receives a second input signal, and outputs a second voltage. The output circuit outputs the first voltage or the second voltage. The detection circuit detects the voltage and outputs a detection result. The control circuit controls back-gate potentials of the first and the second transistors.

Hereinafter, embodiments will be described with reference to the accompanying drawings. In the description below, structural elements having substantially the same functions and configurations will be denoted by the same reference symbols, and repetitive explanations thereof may be omitted. Furthermore, all of the descriptions regarding a certain embodiment will apply as descriptions of another embodiment unless they are explicitly or obviously excluded.

Each function block does not necessarily have to be categorized in the manner of the following example. For example, some of the functions may be executed by a function block other than the exemplary function blocks. In addition, the exemplary function blocks may be divided into further detailed function sub-blocks. The embodiments will not be limited depending on by which block they are identified.

In the specification and claims of the present application, when a certain first element is "connected" to another second element, it includes a state in which the first element is connected to the second element directly, or connected via an element that is always conductive or that becomes selectively conductive.

1. Configuration

Figure 1:
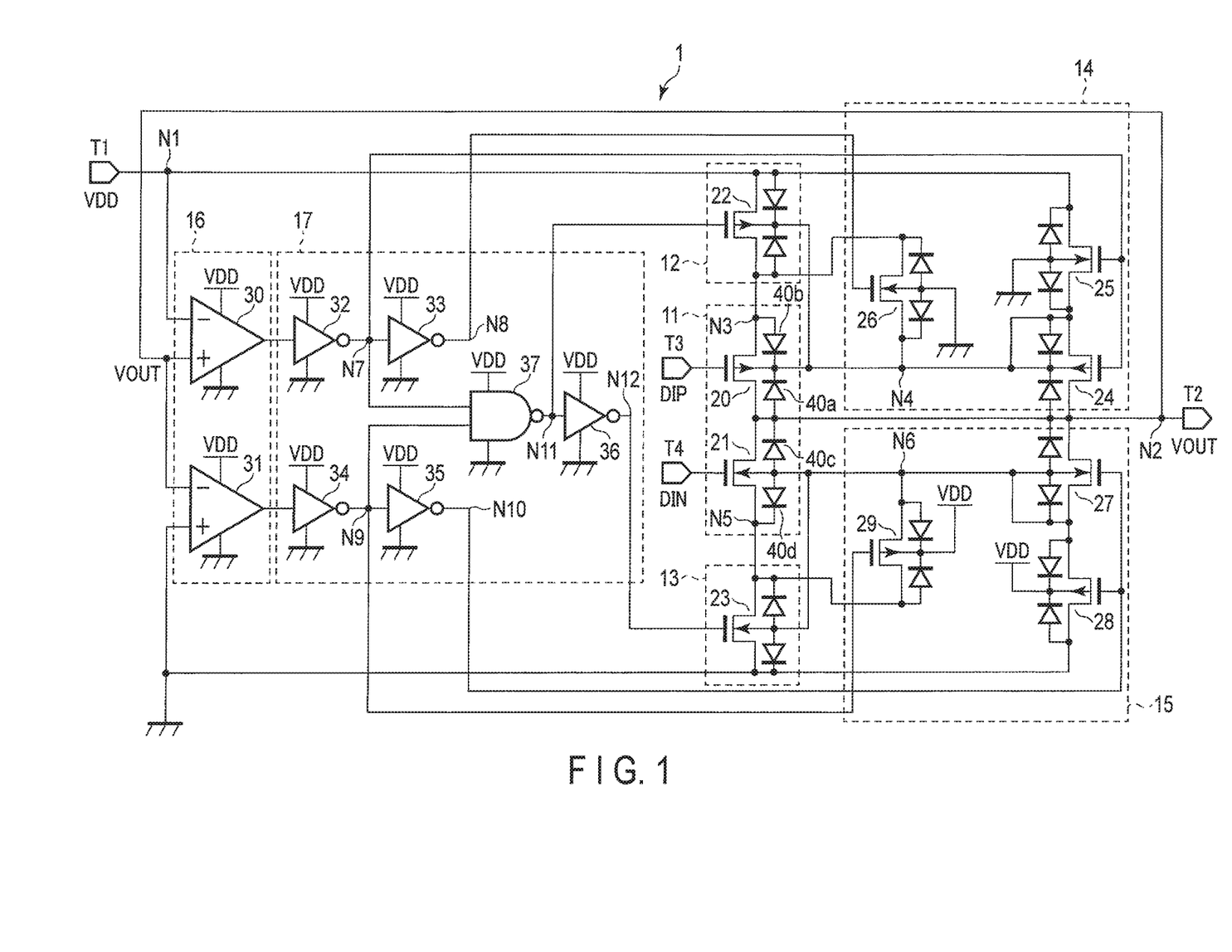
FIG. 1 is a circuit diagram of a driver circuit according to an embodiment.

First of all, regarding a configuration of a semiconductor device according to an embodiment, an example of a driver circuit having a function of preventing an electric current from being reversed between a terminal receiving power supply and a terminal outputting a signal (hereinafter referred to as a function of preventing reversed current) will be explained. FIG. 1 shows a driver circuit according to an embodiment.

As shown, a driver circuit 1 comprises an output circuit 11, a first switch 12, a second switch 13, a first back-gate control circuit 14, a second back-gate control circuit 15, a detection circuit 16, and a logic circuit 17. For example, the driver circuit 1 is integrated and formed on one semiconductor chip. The driver circuit 1 comprises terminals T1, T2, T3, and T4 that can be externally connected. A power supply voltage VDD of the driver circuit 1 is applied to terminal T1. For example, input signals DIP and DIN are input to terminals T3 and T4 from outside. The input signals DIP and DIN are digital signals that can take two logical levels of, for example, a logical "High" level and a logical "Low" level (hereinafter referred to as an "H" level and an "L" level). Terminal T2 outputs signals based on the input signals DIP and DIN. In other words, terminal T1 is a power supply terminal of the driver circuit 1, terminal T2 is an output terminal, and terminals T3 and T4 are input terminals.

The output circuit 11 outputs the "H" level or the "L" level signal to a node N2 based on the input signals DIP and DIN input to terminals T3 and T4. In other words, the output circuit 11 comprises, for example, a transistor 20 that is a p-type Metal Oxide Semiconductor Field Effect Transistor (MOSFET) and, for example, a transistor 21 that is an n-type MOSFET. The transistor 20 has one end of a current path connected to a node N3, the other end of the current path connected to a node N2, a back-gate connected to a node N4, and a gate connected to the terminal T3. The transistor 21 has one end of a current path connected to a node N5, the other end of the current path connected to the node N2, a back-gate connected to a node N6, and a gate connected to the terminal T4.

In the above configuration, by turning "ON" the transistor 20, the node N2 is electrically connected to the node N3, and by turning "ON" the transistor 21, the node N2 is electrically connected to the node N5. A signal of the node N2 is then output outside from the terminal T2 as an output signal (voltage VOUT) of the output circuit 11.

Generally, the MOSFET comprises a parasitic diode between one end and the other end of the current path and the back-gate. For example, the transistor 20 that is a p-type MOSFET comprises parasitic diodes 40a and 40b. An anode of the parasitic diode 40a is connected to the node N2, and a cathode of the parasitic diode 40a is connected to the node N4. An anode of the parasitic diode 40b is connected to the node N3, and a cathode of the parasitic diode 40b is connected to the node N4. The p-type MOSFET other than the transistor 20 also comprises a parasitic diode in the same manner. Furthermore, the transistor 21 that is an n-type MOSFET also comprises parasitic diodes 40c and 40d. A cathode of the parasitic diode 40c is connected to the node N2, and an anode of the parasitic diode 40c is connected to the node N6. A cathode of the parasitic diode 40d is connected to the node NS, and an anode of the parasitic diode 40d is connected to the node N6. The n-type MOSFET other than the transistor 21 also comprises a parasitic diode in the same manner.

The first switch 12 electrically connects or disconnects the node N1 and the node N3. In other words, the first switch 12 comprises, for example, a p-type MOSFET transistor 22. The transistor 22 has one end of a current path connected to the node N1, the other end of the current path connected to the node N3, a back-gate connected to the node N4, and a gate connected to a node N11. When the node N11 becomes the "L" level, which causes the transistor 22 to be turned "ON", the first switch 12 electrically connects the node N1 and the node N3. On the other hand, when the node N11 becomes the "H" level, which causes the transistor 22 to be turned "OFF", the node N1 and the node N3 are electrically disconnected.

The second switch 13 electrically connects or disconnects the node N5 and a ground potential GND. In other words, the second switch 13 comprises, for example, an n-type MOSFET transistor 23. The transistor 23 has one end of a current path connected to the node N5, the other of the current path grounded, a back-gate connected to the node N6, and a gate connected to a node N12. When the node N12 becomes the "H" level, which causes the transistor 23 to be turned "ON", the second switch 13 electrically connects the node N5 and the ground potential GND. On the other hand, when the node N12 becomes the "L" level, which causes the transistor 23 to be turned "OFF", the node N5 and ground potential GND are electrically disconnected.

The first back-gate control circuit 14 controls back-gate potentials of the transistors 20 and 22. In other words, the first back-gate control circuit 14 comprises, for example, a p-type MOSFET transistor 24, and, for example, n-type MOSFET transistors 25 and 26.

The transistor 24 has one end of a current path connected to the node N2, the other end of the current path connected to the node N4, also a back-gate connected to the node N4, and a gate connected to a node N7. The transistor 25 has one end of a current path connected to the node N4, the other end of the current path connected to the node N1, a back-gate grounded, and a gate connected to the node N7. The transistor 26 has one end of a current path connected to the node N4, the other end of the current path connected to the node N3, a back-gate grounded, and a gate connected to a node N8.

In the above configuration, when the transistor 24 is turned "ON", the node N2 and the node N4 are electrically connected. As a result, a voltage VOUT is applied to the back-gates of the transistors 20 and 22. On the other hand, when the transistor 25 is turned "ON", the node N1 and the node N4 are electrically connected. As a result, a power supply voltage VDD is applied to the back-gates of the transistors 20 and 22. Furthermore, when the transistor 26 is turned "ON", the node N3 and the node N4 are electrically connected.

The second back-gate control circuit 15 controls back-gate potentials of the transistors 21 and 23. In other words, the second back-gate control circuit 15 comprises, for example, an n-type MOSFET transistor 27, and, for example, p-type MOSFET transistors 28 and 29.

The transistor 27 has one end of a current path connected to the node N2, the other end of the current path connected to the node N6, also a back-gate connected to the node N6, and a gate connected to a node N10. The transistor 28 has one end of a current path connected to the node N6, the other end of the current path grounded, a back-gate to which the power supply voltage VDD is applied, and a gate connected to the node N10. The transistor 29 has one end of a current path connected to the node N6, the other end of the current path connected to the node N5, the power supply voltage VDD applied to a back-gate, and a gate connected to a node N9.

In the above configuration, when the transistor 27 is turned "ON", the node N2 and the node N6 are electrically connected. As a result, the voltage VOUT is applied to the back-gates of the transistors 21 and 23. On the other hand, when the transistor 28 is turned "ON", the node N6 and the ground potential GND are electrically connected. As a result, the ground potential GND is applied to the back-gates of the transistors 21 and 23. Furthermore, when the transistor 29 is turned "ON", the node N5 and the node N6 are electrically connected.

The detection circuit 16 detects whether or not the voltage VOUT exceeds or falls below a power supply voltage range, that is, whether or not the voltage VOUT is higher than the power supply voltage VDD, and whether or not the voltage VOUT is lower than a voltage of the ground potential GND. In other words, the detection circuit 16 comprises comparators 30 and 31.

The comparator 30 has the power supply voltage VDD applied to a positive power supply terminal, a negative power supply terminal grounded, a non-inverting input terminal connected to the node N2, an inverting input terminal connected to the node N1, and an output terminal connected to an input terminal of an inverter 32. The comparator 31 has the power supply voltage VDD applied to a positive power supply terminal, a negative power supply terminal grounded, a non-inverting input terminal grounded, an inverting input terminal connected to the node N2, and an output terminal connected to an input terminal of an inverter 34.

In the above configuration, the comparator 30 compares the voltage VOUT of the node N2 and the power supply voltage VDD of the node N1. When the voltage VOUT is higher than the power supply voltage VDD, the comparator 30 outputs, for example, the "H" level, and, when the voltage VOUT is not higher than the power supply voltage VDD, the comparator 30 outputs the "L" level. The comparator 31 compares the voltage VOUT of the node N2 and the ground potential GND. When the voltage VOUT is lower than the ground potential GND, the comparator 31 outputs, for example, the "H" level, and, when the voltage VOUT is not lower than the ground potential GND, the comparator 31 outputs the "L" level.

The logic circuit 17 controls the operations of the first switch 12, the second switch 13, the first back-gate control circuit 14, and the second back-gate control circuit 15 based on the output of the detection circuit 16. In other words, the logic circuit 17 comprises inverters 32 to 36 and a NAND gate 37.

The inverter 32 has a positive power supply terminal to which the power supply voltage VDD is applied, and has a negative power supply terminal grounded. The inverter 32 inverts the output signal (the logical "High" level or the logical "Low" level; hereinafter simply referred to as a logical level) of the comparator 30, and outputs the result thereof to the node N7 (the gates of the transistors 24 and 25). The inverter 33 has a positive power supply terminal to which the power supply voltage VDD is applied, and has a negative power supply terminal grounded. The inverter 33 inverts the output signal of the inverter 32, and outputs the result thereof to the node N8 (the gate of the transistor 26). The inverter 34 has a positive power supply terminal to which the power supply voltage VDD is applied, and has a negative power supply terminal grounded. The inverter 34 inverts the output signal of the comparator 31, and outputs the result thereof to the node N9 (the gate of the transistor 29). The inverter 35 has a positive power supply terminal to which the power supply voltage VDD is applied, and has a negative power supply terminal grounded. The inverter 35 inverts the output signal of the inverter 34, and outputs the result thereof to the node N10 (the gates of the transistors 27 and 28). The NAND gate 37 has a positive power supply terminal to which the power supply voltage VDD is applied, and has a negative power supply terminal grounded. The NAND gate 37 executes a NAND operation between the logical level of the node N7 and the logical level of the node N9, and outputs the result thereof to the node N11 (the gate of the transistor 22). The inverter 36 has a positive power supply terminal to which the power supply voltage VDD is applied, and has a negative power supply terminal grounded. The inverter 36 inverts the output signal of the NAND gate 37, and outputs the result thereof to the node N12 (the gate of the transistor 23).

In the manner mentioned above, based on the outputs of the comparators 30 and 31, the logic circuit 17 determines the gate potential of each of the transistors of the first switch 12, the second switch 13, the first back-gate control circuit 14, and the second back-gate control circuit 15.

2. Operation

The operation of the driver circuit 1 will now be explained. In the following, three cases will be explained in accordance with the magnitude of the voltage VOUT. That is, (1) the case of GND≤VOUT≤VDD,
(2) the case of VDD<VOUT, and
(3) the case of VOUT<GND.

2.1 Case (1) Above

Figure 2:
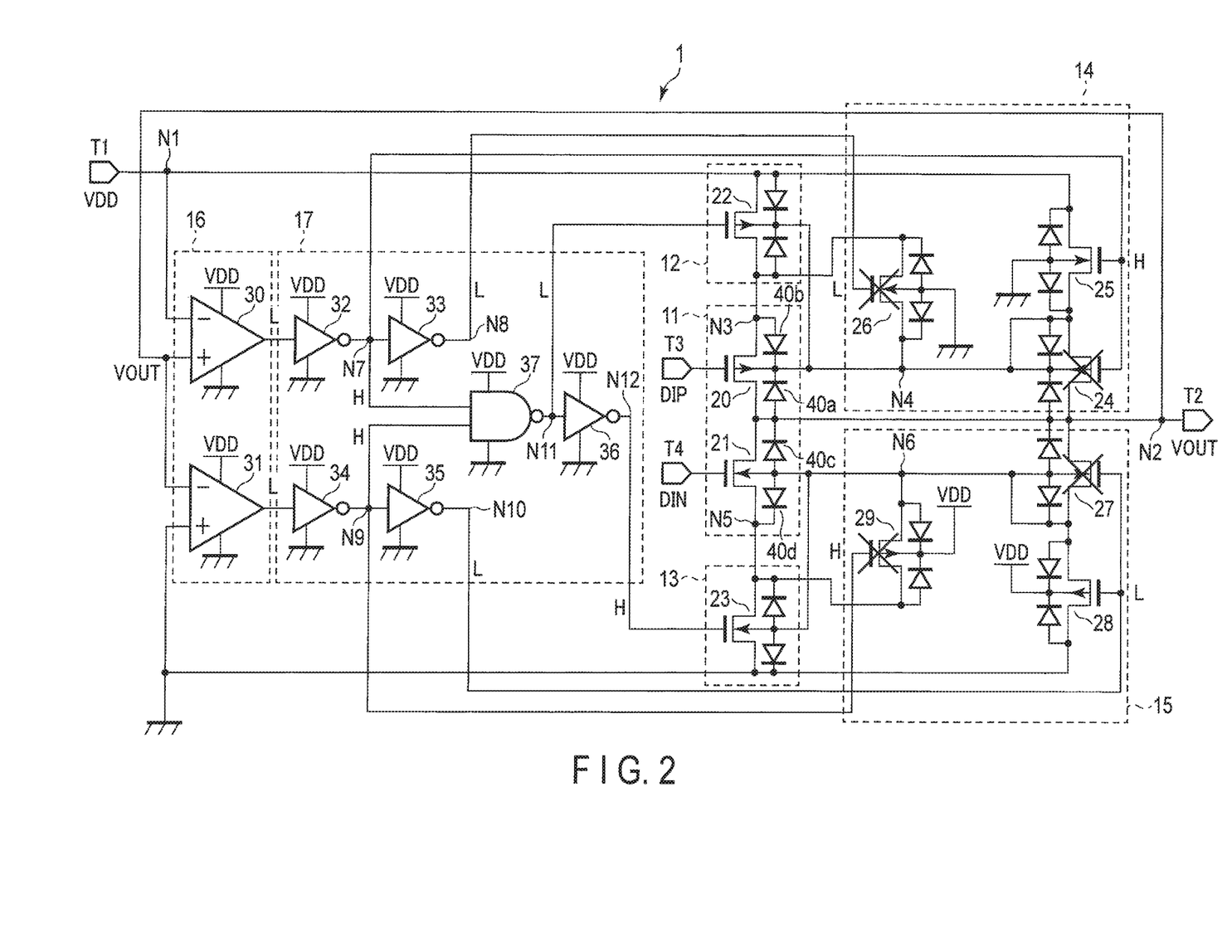
FIG. 2 is a circuit diagram of a driver circuit according to an embodiment.

First, a case in which the voltage VOUT is equal to or higher than the ground potential GND and equal to or lower than the power supply voltage VDD will be explained using FIG. 2. FIG. 2 is a circuit diagram of a driver circuit, in which the logical level or a voltage is noted for each node, and a cross mark is added to the transistors that are turned "OFF".

In the present example, since VOUT≤VDD, the comparator 30 of the detection circuit 16 outputs, for example, the "L" level. Furthermore, since VOUT≥GND, the comparator 31 of the detection circuit 16 outputs, for example, the "L" level.

As a result, the "H" level is given to the node N7, and the "L" level is given to the node N8. Furthermore, the "H" level is given to the node N9, and the "L" level is given to the node N10. As a result, an operation result in the NAND gate 37 becomes the "L" level, and the "L" level is given to the node N11, and the "H" level is given to the node N12.

As a result, in the first back-gate control circuit 14, the transistor 24 is turned "OFF", and the transistor 25 is turned "ON". The node N4 is then electrically connected to the node N1 by the transistor 25. As a result, the power supply voltage VDD is transferred to the back-gates of the transistors 20 and 22 from the node N1. Since the potential of the node N8 is the "L" level, the transistor 26 is turned "OFF".

The same applies to the second back-gate control circuit 15. In other words, the transistor 27 is turned "OFF", and the transistor 28 is turned "ON". The ground potential is then transferred to the node N6 by the transistor 28. As a result, the ground potential is transferred to the back-gates of the transistors 21 and 23. Since the potential of the node N9 is the "H" level, the transistor 29 is turned "OFF".

At the first switch 12, the transistor 22 is turned "ON", and the VDD is transferred to the node N3. In the same manner, at the second switch 13, the transistor 23 is turned "ON", and the ground potential GND is transferred to the node N5.

In this manner, the VDD is applied to the back-gate of the transistor 20 of the output circuit 11 and one end (source) of the current path thereof, and the ground potential GND is applied to the back-gate of the transistor 21 of the output circuit 11 and one end (source) of the current path thereof. As a result, when the input signals DIP and DIN are "H" levels, the transistor 21 is turned "ON", and the transistor 20 is turned "OFF". Therefore, the voltage VOUT becomes the "L" level. On the other hand, when the input signals DIP and DIN are "L" levels, the transistor 20 is turned "ON", and the transistor 21 is turned "OFF". Therefore, the voltage VOUT becomes the "H" level.

2.2 Case (2) Above

Figure 3:
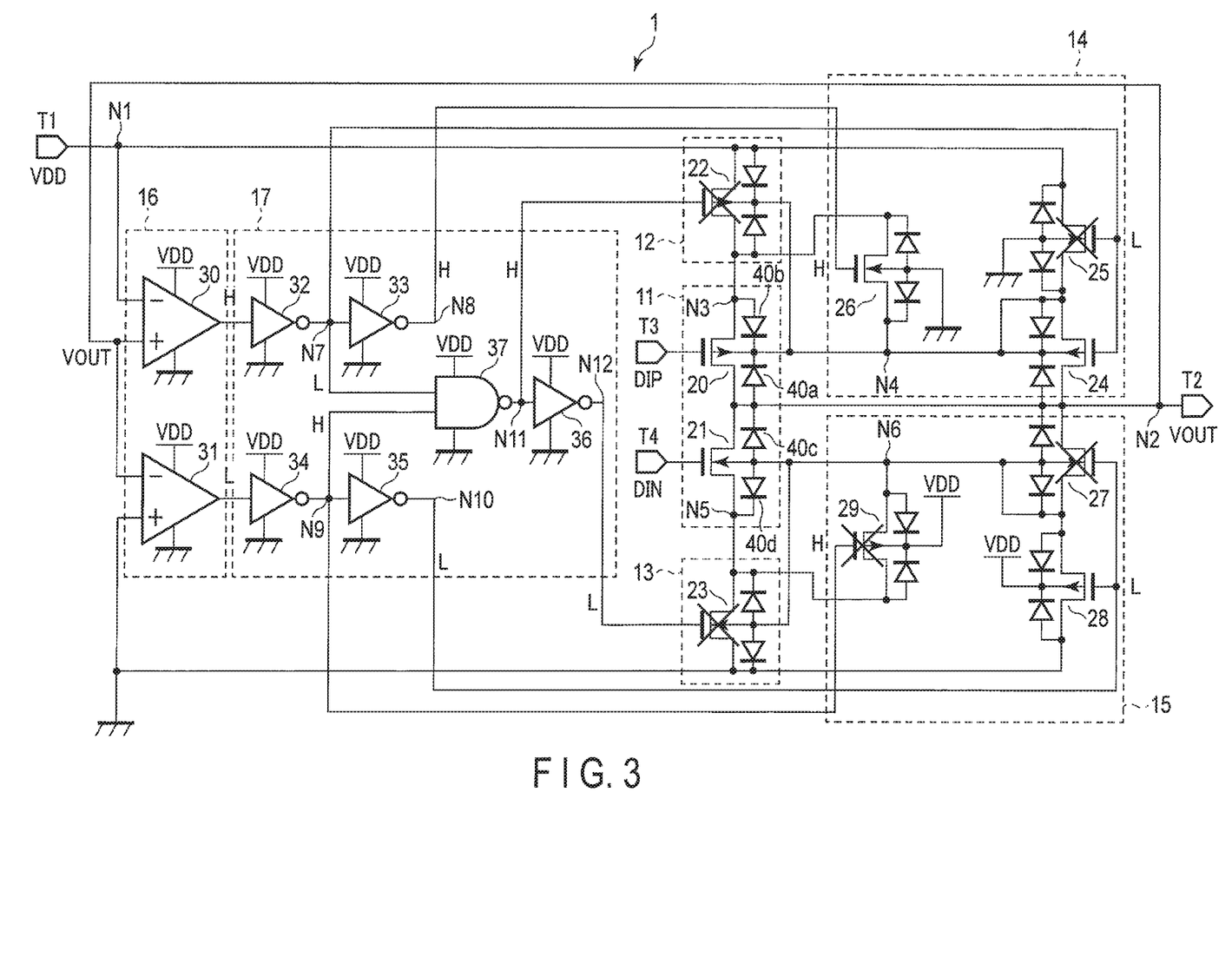
FIG. 3 is a circuit diagram of a driver circuit according to an embodiment.

A case in which the voltage VOUT is higher than the power supply voltage VDD will now be explained using FIG. 3. FIG. 3 is a circuit diagram of a driver circuit, in which the logical level or a voltage is noted for each node, and a cross mark is added to the transistors that are turned "OFF".

In the present example, the voltage VOUT is higher than the power supply voltage VDD. Therefore, the comparator 30 outputs, for example, the "H" level. Furthermore, since VOUT≥GND, the comparator 31 outputs, for example, the "L" level.

As a result, the "L" level is given to the node N7, and the "H" level is given to the node N8. Furthermore, the "H" level is given to the node N9, and the "L" level is given to the node N10. Therefore, the operation result of the NAND gate 37 becomes the "H" level. Accordingly, the "H" level is given to the node N11, and the "L" level is given to the node N12.

Then, in the first back-gate control circuit 14, the transistor 24 is turned "ON", and the transistor 25 is turned "OFF". The back-gates of the transistors 20 and 22 are then connected to the node N2 by the transistor 24. In other words, the voltage VOUT is applied to these back-gates. Furthermore, the transistor 26 is turned "ON", and the node N3 and the node N4 are electrically connected.

The case explained in item 2.1 above also applies to the second back-gate control circuit 15. In other words, the transistor 27 is turned "OFF", and the transistor 28 is turned "ON". The ground potential is then transferred to the node N6 by the transistor 28. As a result, the ground potential is transferred to the back-gates of the transistors 21 and 23. Since the potential of the node N9 is an "H" level, the transistor 29 is turned "OFF".

Furthermore, at the first switch 12, the transistor 22 is turned "OFF", and the node N3 and the node N1 are electrically disconnected. In the same manner, at the second switch 13, the transistor 23 is turned "OFF", and the node N5 and the ground potential GND are electrically disconnected.

In the above manner, the voltage VOUT is applied to the back-gate of the transistor 20 of the output circuit 11, and to one end and the other end (source and drain) of the current path thereof. Furthermore, the first switch 12 and the second switch 13 are turned "OFF", and the output circuit 11 becomes electrically disconnected with the power supply voltage VDD and the ground potential GND. As a result, regardless of the state of the input signals DIP and DIN, the transistors 21 and 22 are not turned "ON". Consequently, the node N2 is electrically disconnected with the power supply voltage VDD and the ground potential GND.

2.3 Case (3) Above

Figure 4:
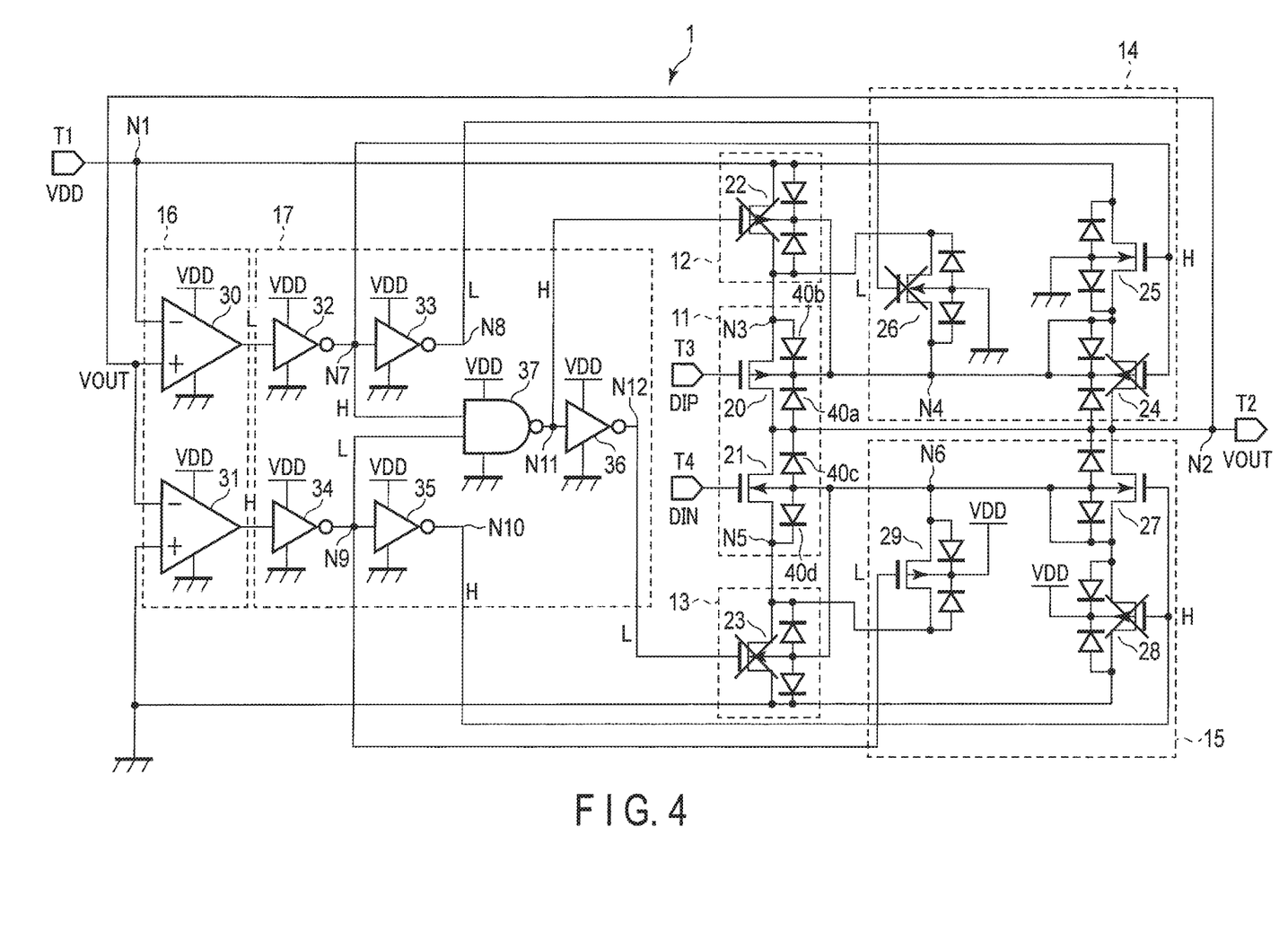
FIG. 4 is a circuit diagram of a driver circuit according to an embodiment.

A case in which the voltage VOUT is lower than the ground potential GND will now be explained using FIG. 4. FIG. 4 is a circuit diagram of a driver circuit, in which the logical level or a voltage is noted for each node, and a cross mark is added to the transistors that are turned "OFF".

In the present example, the voltage VOUT is lower than the ground potential GND. Therefore, the comparator 31 outputs, for example, the "H" level. Furthermore, in the present example, since VOUT≤VDD, the comparator 30 outputs, for example, the "L" level.

As a result, the "H" level is given to the node N7, and the "L" level is given to the node N8. Furthermore, the "L" level is given to the node N9, and the "H" level is given to the node N10. Therefore, the operation result of the NAND gate 37 becomes the "H" level. Accordingly, the "H" level is given to the node N11, and the "L" level is given to the node N12.

Then, in the second back-gate control circuit 15, the transistor 27 is turned "ON", and the transistor 28 is turned "OFF". The back-gates of the transistors 21 and 23 are then connected to the node N2 by the transistor 27. In other words, the voltage VOUT is applied to these back-gates. Furthermore, the transistor 29 is turned "ON", and the node N5 and the node N6 are electrically connected.

The case explained in item 2.1 above also applies to the first back-gate control circuit 14. In other words, the transistor 24 is turned "OFF", and the transistor 25 is turned "ON". The node N4 is then electrically connected to the node N1 by the transistor 25. As a result, the power supply voltage VDD is transferred to the back-gates of the transistors 20 and 22 from the node N1. Since the potential of the node N8 is the "L" level, the transistor 26 is turned "OFF".

In the same manner as the case explained in item 2.2 above, the first switch 12 and the second switch 13 are both turned "OFF".

In the above manner, the voltage VOUT is applied to the back-gate of the transistor 21 of the output circuit 11, and to one end and the other end (source and drain) of the current path thereof. Furthermore, the first switch 12 and the second switch 13 are turned "OFF", and the output circuit 11 becomes electrically disconnected with the power supply voltage VDD and the ground potential GND. As a result, regardless of the state of the input signals DIP and DIN, the transistors 21 and 22 are not turned "ON". Consequently, the node N2 is electrically disconnected with the power supply voltage VDD and the ground potential GND.

3. Advantageous Effects of Present Embodiment

The present embodiment is capable of improving operation reliability of a semiconductor device. The effect will be explained below.

According to the present embodiment, a current that is reversed from an output terminal when a voltage VOUT exceeds or falls below a power supply voltage range can be suppressed.

A driver circuit according to the present embodiment that is provided with a function of preventing a reversed current comprises an output circuit 11, a first switch 12, a second switch 13, a first back-gate control circuit 14, a second back-gate control circuit 15, a detection circuit 16, and a logic circuit 17. The detection circuit 16 detects that the voltage VOUT exceeds or falls below the power supply voltage range, and the first back-gate control circuit 14, the second back-gate control circuit 15, and the logic circuit 17 control back-gates of the output circuit 11, the first switch 12, and the second switch 13 based on the detection result. Furthermore, the first switch 12 and the second switch 13 electrically connect or disconnect the output circuit 11 with a power supply voltage VDD and a ground potential GND based on the detection result of the detection circuit 16.

Specifically, in the case (VDD<VOUT) mentioned in item 2.2 above, the voltage VOUT is applied to the back-gate of the transistor 20 and to one end and the other end (source and drain) of the current path by the first back-gate control circuit 14. Furthermore, the ground potential GND is applied to the back-gate of the transistor 21 by the second back-gate control circuit 15. As a result, a potential difference occurring at both ends of the parasitic diode of the transistor 20 becomes a reverse bias state or becomes approximately the same potential, which can suppress the diode from being turned on. Furthermore, by turning "OFF" the first switch 12 and the second switch 13, the output circuit 11 is electrically disconnected with the power supply voltage VDD and the ground potential GND. In addition, as measures to be taken against a current flowing into the power supply voltage VDD through the diode between the drain and the back-gate of the transistor 22 (the power supply voltage VDD in normal operations), the voltage VOUT is applied to the back-gate of the transistor 22 by the first back-gate control circuit 14. These controls can suppress a current from being reversed from the output terminal.

Furthermore, in the case (VOUT<GND) mentioned in item 2.3, the power supply voltage VDD is applied to the back-gate of the transistor 20 by the first back-gate control circuit 14. The voltage VOUT is also applied to the back-gate of the transistor 21 and to one end and the other end (source and drain) of the current path by the second back-gate control circuit 15. As a result, a potential difference occurring at both ends of the parasitic diode of the transistor 21 becomes a reverse bias state or becomes approximately the same potential, which can suppress the diode from being turned on. Furthermore, by turning "OFF" the first switch 12 and the second switch 13, the output circuit 11 is electrically disconnected with the power supply voltage VDD and the ground potential GND. In addition, as measures to be taken against a current flowing into the ground potential GND through the diode between the drain and the back-gate of the transistor 23 (the ground potential GND in normal operations), the voltage VOUT is applied to the back-gate of the transistor 23 by the the second back-gate control circuit 15. These controls can suppress a current from being reversed from the output terminal.

On the other hand, in the case (GND≤VOUT≤VDD) mentioned in item 2.1, the power supply voltage VDD is applied to the back-gates of the transistors 20 and 22 by the first back-gate control circuit 14. Furthermore, the ground potential GND is applied to the back-gates of the transistors 21 and 23 by the second back-gate control circuit 15. The first switch 12 and the second switch 13 are turned "ON", and the output circuit 11 is electrically connected with the power supply voltage VDD and the ground potential GND. As a result, the output circuit 11 is able to execute normal operations, in which the "H" level or the "L" level is output based on the input signals DIP and DIN.

By controlling the back-gate in this manner, in the case where the voltage VOUT is within the power supply voltage range (0V to VDD), the output circuit 11 can output the "H" level or the "L" level based on the input signals DIP and DIN. In contrast, in the case where the voltage VOUT exceeds or falls below the power supply voltage range, by suppressing the parasitic diode of the transistor from being turned on, the current can be suppressed from being reversed from the output terminal. In this manner, by suppressing the current from being reversed, fluctuation caused by a reversed current can be suppressed in the power supply voltage VDD or the ground potential GND, which will enhance operation reliability.

Figure 5:
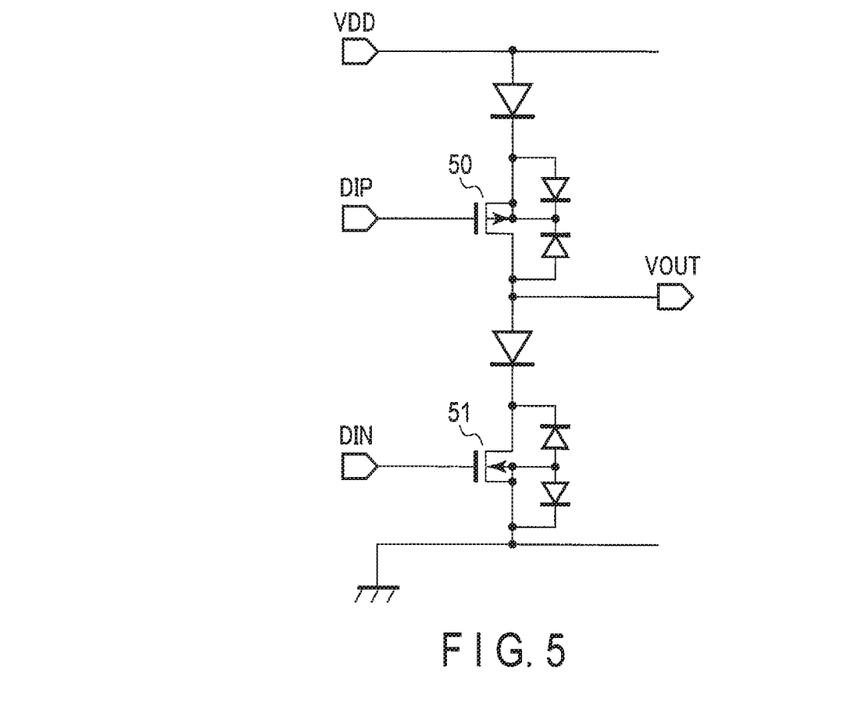
FIG. 5 is a circuit diagram of a driver circuit according to a comparative example of an embodiment.

In other words, according to the present embodiment, a reversed current can be suppressed without having to insert a diode element in series into a signal path as shown in FIG. 5 (for example, between the source of the transistor 50 and the power supply voltage VDD, and between the drain of the transistor 51 and the voltage VOUT). Generally, diode elements are widely used as rectifying elements; however, in the present application, a reversed current caused by turning on the parasitic diode is suppressed by switching voltages to be applied to the back-gate of the transistor. In other words, there is no need to suppress a reversed current that occurs by inserting diodes in series into a signal path, and when the parasitic diode is turned on. As a result, a potential difference occurring between the anode and cathode when applying a forward voltage to the diode can suppress limitation on an output amplitude. In other words, a wide output that sufficiently utilizes the power supply voltage range can be realized.

Furthermore, in FIG. 5, since the arrangement of the transistors viewed from the output terminal are asymmetrical between the power supply voltage VDD side and the ground potential GND side, the output waveforms have poor symmetry. According to the present embodiment, since the arrangement of the transistors viewed from the output terminal are symmetrical between the power supply voltage VDD side and the ground potential GND side, the output waveforms have excellent symmetry.

4. Modified Example, Etc.

Figure 6:
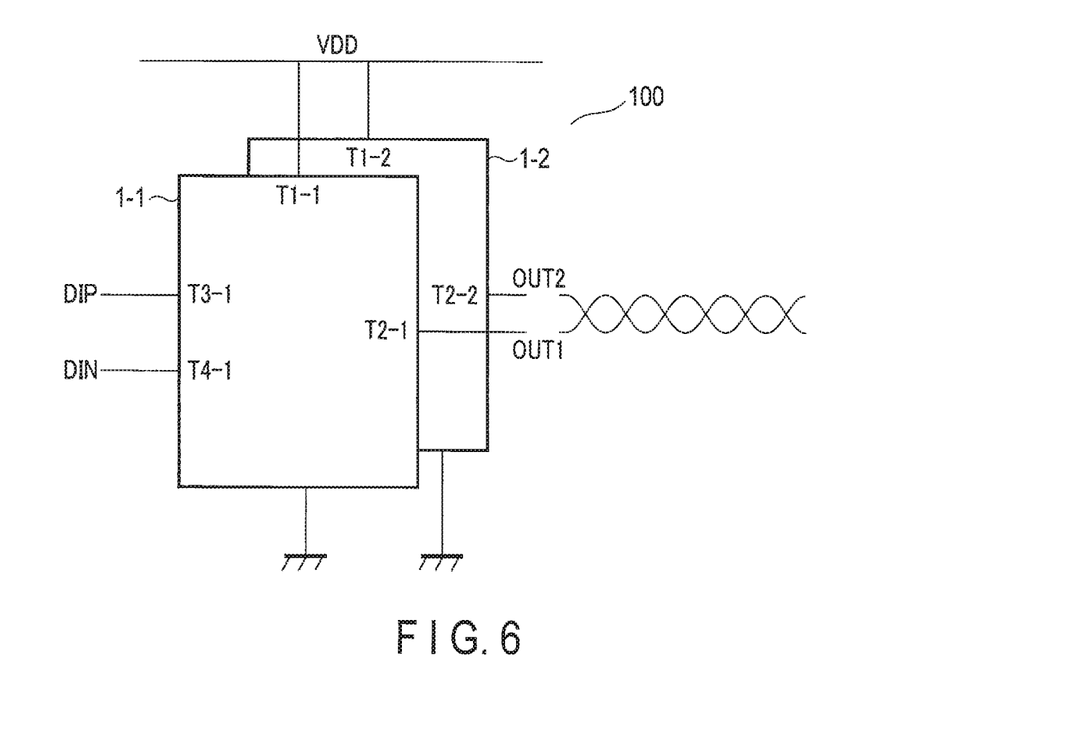
FIG. 6 is a block diagram of a differential driver circuit according to a modified example of an embodiment.

The above embodiment can also be applied to an output circuit that outputs complementary signals. FIG. 6 shows an example of such case, in which two of the driver circuits explained in the above embodiment are combined. In other words, a differential signal driver circuit 100 is formed by a driver circuit 1-1 that outputs a signal OUT1 and a driver circuit 1-2 that outputs a signal (a reversed-phase signal) OUT2 that is complementary with respect to the signal OUT1. Control signals to be input to the driver circuit 1-2 may also be, for example, what is obtained by reversing input signals DIP and DIN that are to be input to the driver circuit 1-1. Furthermore, the differential signal driver circuit 100 may also be applied to a communication system that utilizes differential signals, such as an RS485 standard or an RS422 standard.

Figure 7:
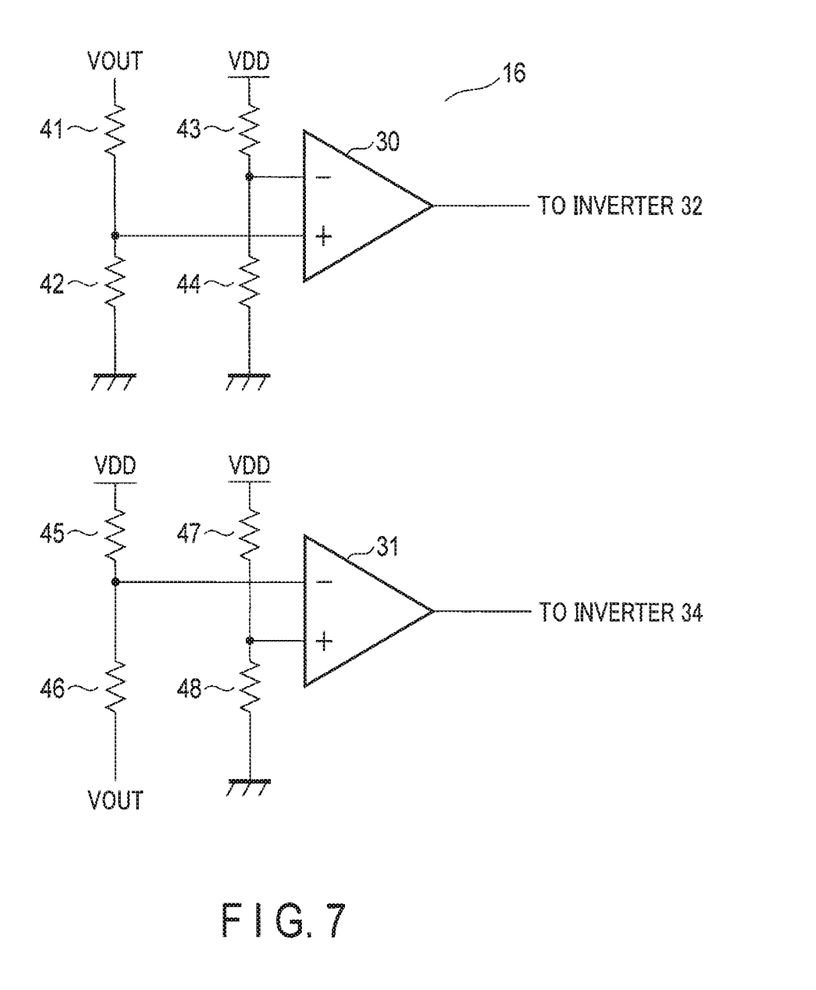
FIG. 7 is a circuit diagram of a detection circuit according to a modified example of to an embodiment.

Furthermore, for example, a detection circuit 16 may comprise a conversion circuit in its input unit. As an example, the detection circuit 16 comprising a potential conversion circuit realized by resistance voltage division is shown in FIG. 7. The voltage to be compared is converted by resistance voltage division so as to become close to within a power supply voltage range of a comparator. A voltage VOUT is applied to one end of a resistance element 41, the other end of the resistance element 41 is connected to one end of a resistance element 42, and the other end of the resistance element 42 is grounded. A connection node between the resistance element 41 and the resistance element 42 is connected to a non-inverting input terminal of a comparator 30. The voltage VOUT is divided by the resistance elements 41 and 42, and a voltage closer to the ground potential GND than to the voltage VOUT is input to the non-inverting input terminal of the comparator 30. In the same manner, a power supply voltage VDD is applied to one end of a resistance element 43, the other end of the resistance element 43 is connected to one end of a resistance element 44, and the other end of the resistance element 44 is grounded. A connection node between the resistance element 43 and the resistance element 44 is connected to an inverting input terminal of the comparator 30. The power supply voltage VDD is divided by the resistance elements 43 and 44, and a voltage closer to the ground potential GND than to the power supply voltage VDD is input to the inverting input terminal of the comparator 30. Even if an input voltage range of the comparator 30 is limited, this allows to widen a range of the voltage VOUT in which comparison can be carried out. The same applies to when dividing the voltage VOUT and the ground potential GND by resistance elements 45 to 48. In the case of using resistance voltage division, the ratio of resistance value between the resistance elements 41 and 42 is preferred to be equal to the ratio of resistance value between the resistance elements 43 and 44. In the same manner, the ratio of resistance value between the resistance elements 45 and 46 is preferred to be equal to the ratio of resistance value between the resistance elements 47 and 48. It is also preferable that a total value of the resistance values of the resistance elements 41 and 42 is equal to a total value of the resistance values of the resistance elements 45 and 46. However, as long as it is possible to compare the voltage VOUT with the power supply voltage VDD or the ground potential GND, it is not limited to these conditions.

Furthermore, as long as the detection circuit 16 is able to compare a voltage of an output terminal with the power supply voltage VDD or the ground potential GND, and determine them, it may be configured by using various circuits, without being limited to a comparator. In addition, as long as a logic circuit 17 is able to control a gate of each transistor based on a detection result of the detection circuit 16, it may be configured by a logic circuit that is different from that of the above embodiment. It may also be incorporated into other circuits.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an output circuit including
      a first transistor which includes one end of a current path connected to an output node, receives a first input signal, and outputs a first voltage to the output node in accordance with the first input signal, and
      a second transistor which includes one end of a current path connected to the output node, receives a second input signal, and outputs a second voltage to the output node in accordance with the second input signal,
      wherein the output circuit outputs the first voltage or the second voltage from the output node based on the first input signal and the second input signal;
   a detection circuit that detects a voltage of the output node, and outputs a detection result; and
   a control circuit that controls back-gate potentials of the first and the second transistors based on the detection result,
   wherein,
   the first voltage is larger than the second voltage, and
   in a case where the voltage of the output node exceeds the first voltage, the control circuit connects a back-gate of the first transistor to the output node, and, in a case where the voltage of the output node is below the second voltage, the control circuit connects a back-gate of the second transistor to the output node.

2. The device according to claim 1, wherein, in a case where the voltage of the output node is included in a range from the first voltage to the second voltage, the control circuit applies the first voltage to the back-gate of the first transistor, and applies the second voltage to the back-gate of the second transistor.

3. The device according to claim 1, further comprising:
   a third transistor that supplies the first voltage to the first transistor; and
   a fourth transistor that supplies the second voltage to the second transistor.

4. The device according to claim 3, wherein
   in a case where the voltage of the output node exceeds the first voltage, the control circuit connects a back-gate of the third transistor to the output node, and
   in a case where the voltage of the output node is below the second voltage, the control circuit connects a back-gate of the fourth transistor to the output node.

5. The device according to claim 4, wherein, in a case where the voltage of the output node is included in a range from the first voltage to the second voltage, the control circuit applies the first voltage to the back-gates of the first transistor and the third transistor, and applies the second voltage to the back-gates of the second transistor and the fourth transistor.

6. The device according to claim 4, wherein, in cases where the voltage of the output node exceeds the first voltage, and where the voltage of the output node is below the second voltage, the control circuit turns off the third transistor and the fourth transistor.

7. The device according to claim 1, wherein the control circuit comprises:
   a third transistor that is connected between the back-gate of the first transistor and the output node;
   a fourth transistor that is able to apply the first voltage to the back-gate of the first transistor;
   a fifth transistor that is connected between the back-gate of the second transistor and the output node; and
   a sixth transistor that is able to apply the second voltage to the back-gate of the second transistor.

8. The device according to claim 7, wherein the control circuit
   in a case where the voltage of the output node is included in a range from the first voltage to the second voltage, turns on the fourth transistor and the sixth transistor, and turns off the third transistor and the fifth transistor,
   in a case where the voltage of the output node exceeds the first voltage, turns on the third transistor and the sixth transistor, and turns off the fourth transistor and the fifth transistor, and
   in a case where the voltage of the output node is below the second voltage, turns on the fourth transistor and the fifth transistor, and turns off the third transistor and the sixth transistor.

9. The device according to claim 8, wherein
   a back-gate of the third transistor is connected to the back-gate of the first transistor,
   the second voltage is applied to a back-gate of the fourth transistor,
   a back-gate of the fifth transistor is connected to the back-gate of the second transistor, and
   the first voltage is applied to a back-gate of the sixth transistor.

10. The device according to claim 4, wherein the control circuit comprises:
    a fifth transistor connected between the back-gate of the first transistor and the back-gate of the third transistor and the output node;
    a sixth transistor that is able to apply the first voltage to the back-gate of the first transistor and the back-gate of the third transistor;
    a seventh transistor connected between a connection node between the first transistor and the third transistor and the back-gate of the first transistor and the back-gate of the third transistor;
    an eighth transistor connected between the back-gate of the second transistor and the back-gate of the fourth transistor and the output node;
    a ninth transistor that is able to apply the second voltage to the back-gate of the second transistor and the back-gate of the fourth transistor; and
    a tenth transistor connected between a connection node between the second transistor and the fourth transistor and the back-gate of the second transistor and the back-gate of the fourth transistor.

11. The device according to claim 10, wherein the control circuit
    in a case where the voltage of the output node is included in a range from the first voltage to the second voltage, turns on the third transistor, the fourth transistor, the sixth transistor, and the ninth transistor, and turns off the fifth transistor, the seventh transistor, the eighth transistor, and the tenth transistor,
    in a case where the voltage of the output node exceeds the first voltage, turns on the fifth transistor, the seventh transistor, and the ninth transistor, and turns off the third transistor, the fourth transistor, the sixth transistor, the eight transistor, and the tenth transistor, and
    in a case where the voltage of the output node is below the second voltage, turns on the sixth transistor, the eighth transistor, and the tenth transistor, and turns off the third transistor, the fourth transistor, the fifth transistor, the seventh transistor, and the ninth transistor.

12. The device according to claim 11, wherein
a back-gate of the fifth transistor is connected to the back-gate of the first transistor and the back-gate of the third transistor,
the second voltage is applied to a back-gate of the sixth transistor,
the second voltage is applied to a back-gate of the seventh transistor,
a back-gate of the eighth transistor is connected to the back-gate of the second transistor and the back-gate of the fourth transistor,
the first voltage is applied to a back-gate of the ninth transistor, and
the first voltage is applied to a back-gate of the tenth transistor.

13. The device according to claim 1, wherein
the detection circuit comprises:
a first comparator that compares the voltage of the output node and the first voltage; and
a second comparator that compares the voltage of the output node and the second voltage, and
based on an output of the first comparator and an output of the second comparator, the detection circuit outputs one of signals indicating whether or not the voltage of the output node of the output circuit exceeds the first voltage, is below the second voltage, or is between the first voltage and the second voltage.

14. The device according to claim 13, further comprising:
a conversion circuit that converts at least one of the first voltage, the second voltage, or the voltage of the output node, wherein
while maintaining a magnitude relation between the first voltage or the second voltage and the voltage of the output node, the conversion circuit converts at least one of the first voltage and the voltage of the output node into a lower voltage, or converts at least one of the second voltage and the voltage of the output node into a higher voltage, and
at least one of the first comparator and the second comparator performs comparison operation based on the converted voltage.

15. The device according to claim 14, wherein
the conversion circuit comprises a first resistance element and a second resistance element, one end of the first resistance element and one end of the second resistance element being connected to a first node,
the voltage of the output node is applied to the other end of the first resistance element, and the first voltage is applied to another end of the second resistance element, or
the voltage of the output node is applied to the other end of the first resistance element, and the second voltage is applied to the other end of the second resistance element, or
the first voltage is applied to the other end of the first resistance element, and the second voltage is applied to the other end of the second resistance element, and
at least one of the first comparator and the second comparator performs comparison operation based on the voltage of the first node.

16. An apparatus comprising:
a first device including the semiconductor device according to claim 1, and
a second device including the semiconductor device according to claim 1, wherein
an output voltage of the first device can be output as a positive signal of a differential signal, and an output voltage of the second device can be output as a negative signal of a differential signal.

* * * * *